United States Patent
Mizutani et al.

(10) Patent No.: US 6,390,874 B2
(45) Date of Patent: May 21, 2002

(54) ORGANIC ELECTROLUMINESCENT DISPLAY DEVICE AND METHOD OF FORMING THE SAME USING A SHADOW MASK

(75) Inventors: Kazuhiro Mizutani; Shigeyoshi Ootsuki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/818,732

(22) Filed: Mar. 28, 2001

Related U.S. Application Data

(62) Division of application No. 09/027,557, filed on Feb. 23, 1998, now Pat. No. 6,326,726.

(30) Foreign Application Priority Data

Feb. 21, 1997 (JP) ............................................. 9-037439

(51) Int. Cl.⁷ .................................................. H01J 9/02
(52) U.S. Cl. ........................................ 445/24; 313/505
(58) Field of Search ....................... 427/66, 64; 445/24, 445/25; 313/504, 505, 500

(56) References Cited

U.S. PATENT DOCUMENTS

| | | |
|---|---|---|
| 5,294,869 A | 3/1994 | Tang et al. |
| 5,949,188 A | 9/1999 | Leising et al. |
| 6,087,772 A | * 7/2000 | Ootsuki et al. ............. 313/505 |

FOREIGN PATENT DOCUMENTS

| | | |
|---|---|---|
| JP | 5258859 | 10/1993 |
| JP | 5258860 | 10/1993 |
| JP | 8315981 | 11/1996 |

* cited by examiner

Primary Examiner—Kenneth J. Ramsey
Assistant Examiner—Joseph Williams
(74) Attorney, Agent, or Firm—Young & Thompson

(57) ABSTRACT

An organic electroluminescent display device comprising a transparent supporting substrate, a transparent anode of a plurality of stripes provided on the transparent supporting substrate, an organic electroluminescent layer extending over the transparent supporting substrate and the transparent anode, and a cathode of a plurality of stripes which extend in a direction perpendicular to a direction along which the stripes of the anode extend, wherein at least an insulative separation wall is provided between the stripes of the anode and the insulative separation wall has a height which is higher than a sum of a thickness of the anode and a thickness of the organic electroluminescent layer and further wherein the organic electroluminescent layer also extends over the insulative separation wall.

5 Claims, 13 Drawing Sheets

ORGANIC ELECTROLUMINESCENT DISPLAY DEVICE AND METHOD OF FORMING THE SAME USING A SHADOW MASK

RELATED APPLICATION

This application is a division of application Ser. No. 09/027,557 filed on Feb. 23, 1998, is now U.S. Pat. No. 6,326,726 the entire contents of which are hereby incorporated by reference.

BACKGROUND OF THE INVENTION

The present invention relates to an organic electroluminescent display device and a method of forming the same, and more particularly to an organic electroluminescent display device suitable for a flat display and a method of forming the same.

FIG. 1 is a fragmentary cross sectional elevation view illustrative of a conventional organic electroluminescent display device. The organic electroluminescent display device is formed on a transparent supporting substrate 31. Usually, a transparent electrode made of indium tin oxide is first patterned on the transparent supporting substrate 31 by use of a photolithography and subsequent wet etching in chemicals including ferric chloride. The patterned indium tin oxide transparent electrode 32 serves as an anode. An organic electroluminescent layer 35 is deposited on the patterned indium tin oxide transparent electrode 32 by a vacuum evaporation method. A cathode 37 is then patterned on the organic electroluminescent layer 35. If the cathode 37 is patterned by a wet etching which uses a photo-resist technique, it is required to remove the used photo-resist film from the cathode 37 after the wet etching. This causes the following problem.

When the used photo-resist film is removed from the cathode 37 and also when the etching to the cathode is made by the photo-resist, a moisture infiltration appears onto an interface between the organic electroluminescent layer and the cathode. This moisture infiltration causes remarkable deterioration in luminescent property and life-time characteristic.

In order to avoid those problems, a shadow mask may be formed for evaporations of a plurality of organic electroluminescent materials and the cathode to form the organic electroluminescent display device.

If the shadow mask is used as illustrated in FIG. 1, a transparent electrode made of, for example, indium tin oxide is deposited by a sputtering method on the transparent supporting substrate 31 of glass for subsequent patterning of the transparent electrode into a stripe shape anode 32. Then, first and second organic electroluminescent layers 33 and 34 are laminated entirely over the anode 32 and the transparent supporting substrate 31. The laminations of the first and second organic electroluminescent layers 33 and 34 form an organic electroluminescent layer 35.

A shadow mask made of a metal is prepared which has a striped shielding portion 36 with stripe-shaped slits. This shadow mask is placed so that the stripe-shaped slits have a longitudinal direction perpendicular to the direction of the anode pattern and the shadow mask is made into contact with the organic electroluminescent layer 35. Thereafter, the cathode material is deposited by a vacuum evaporation onto the organic electroluminescent layer 35 through he shadow mask.

In Japanese laid-open patent publication No. 5-275172, there is disclosed an organic electroluminescent image display and a method of manufacturing the same. A plurality of indium tin oxide anode lines are aligned over the transparent supporting substrate at an interval in a lateral direction. Walls are provided which are distanced in a direction perpendicular to the anode lines before the organic electroluminescent layer is formed on the transparent supporting substrate surface having the indium tin oxide anode lines and the walls. The walls have a height which is higher than the thickness of the organic electroluminescent layer. Then, a metal vapor phase deposition source is set at such an angle that an isolation wall is inserted between the source and an adjacent portion to the organic electroluminescent layer surface whereby a metal film serving as a cathode is formed.

As a material of the walls, a spin-coated negative photo-resist film or a dry film is available. The photo-resist or the dry film is exposed to an optical pattern so that the exposed region of the photo-resist shows a cross-linking reaction and to be insoluble whilst the unexposed region of the photo-resist is developed and cleaned to be removed whereby the patterned walls of photo-resist are made.

Alternatively, there is disclosed the following method of forming the walls. A photo-resist is provided by patterning process on a region surrounding an area on which walls are intended to be formed later. Subsequently, a wall material such as silica, silicon nitride or alumina is applied on the above region. Thereafter, the photo-resist is removed by a lift-off method to form the walls.

If a metal for cathode is deposited by a vacuum evaporation at an oblique angle, then the metal is isolated along the walls at a potion where the wall is sandwiched between that portion and the organic electroluminescent layer. As a result, he cathode can be formed which has the desired pattern.

A voltage in the range of 5–20V across the anode and the cathode is applied to between the anode and cathode to cause a current though the organic electroluminescent layer whereby the organic electroluminescent display device formed in the above manners is driven.

The above conventional organic electroluminescent display device has such a structure that the organic electroluminescent layer is sandwiched between the anode and cathode. A voltage is applied between the anode and cathode to cause luminescence of the organic electroluminescent layer, for which reason in order to display a desired pattern, desired patterning to the abode and cathode is required. In a dot-matrix display, the patterning to the anode and cathode is so made that the anode and cathode are made cross to each other in matrix.

As described above, the patterning to the anode on the transparent supporting substrate is relatively easy. The problem is in the patterning to the cathode on the organic electroluminescent layer. If the wet etching method using the photo-resist technique is used, then the cathode is selectively etched and thereafter the photo-resist is removed. At those times, a moisture infiltration appears onto an interface between the organic electroluminescent layer and the cathode, whereby the luminescent property and the life time of the display are remarkable deteriorated.

To avoid the above problem, it had been proposed to use a shadow mask for patterning the cathode on the organic electroluminescent layer. It had also been proposed to use the patterning to the cathode by use of the photo-resist walls as masks.

In the method using the shadow mask, if, however, the substrate has a large size, then the shadow mask is not securely fitted on the organic electroluminescent layer at a center portion of the transparent supporting substrate due to a weight of the shadow mask whereby it is difficult to obtain a desired and accurate pattern of the cathode. This might form a shot circuit of the cathode. Even if the substrate size is not so large but a fine pattern is required, then it is required that the shadow mask is thin. Such thin shadow mask has a small rigidity whereby it is difficult to securely contact the shadow mask with the organic electroluminescent layer.

To attempt to settle the above problem, it had been proposed that a thin shadow mask of a magnetic material is formed and a magnet is placed on an opposite surface to the surface of the transparent supporting substrate on which the organic electroluminescent layer has been provided, so that stripe shaped portions of the shadow mask is forced into securely contact with the organic electroluminescent layer by a magnetic force. It might, however, be possible that the shadow mask has provided a scratch 38 to the organic electroluminescent layer before the shadow mask is made into securely contact with the organic electroluminescent layer. The thickness of the organic electroluminescent layer is thinner than 1 micrometer to suppress the driving voltage at not more than 20V, for which reason the scratch 38 might reach the anode beneath the organic electroluminescent layer. If the scratch 38 exits at a position where a cathode pattern is intended to be formed, a metal for cathode is made into contact with the anode 32 through the scratch 38 whereby a short circuit is then formed between the anode and cathode. The short circuit between the anode and cathode prevents the necessary voltage from being applied to the organic electroluminescent layer sandwiched between the cathode and anode. As a result, no influence appears on the display pixel located at a position where the short circuit is formed. This causes a drop of the yield of the display.

In the later method using the photo-resist walls, it is required to provide walls between the organic electroluminescent layer and the an evaporation source for deposition of a metal for the cathode, for which reason a large vacuum evaporator is required for patterning a cathode over a large size transparent supporting substrate. This requires a large cost for the equipment. The manufacturing cost is therefore increased.

Adjacent two cathodes are distanced at a distance which corresponds to the sum of a width of the wall and a width of a region projected onto the organic electroluminescent layer surface along the walls sandwiched between the evaporation source for evaporating a metal of cathode and the organic electroluminescent layer. For this reason, in case of the large size display substrate, the separation width of the pixels onto which the walls are projected is different between positions near and far the evaporation source for evaporating the metal of cathode.

Further, if the patterns extend almost in parallel to a straight line connecting between the evaporation source for evaporating the metal of cathode and the transparent supporting substrate, then the wall has no part which is projected onto the organic electroluminescent layer. This means it impossible to pattern the cathode over the organic electroluminescent layer.

In the above circumstances, it had been required to develop a novel organic electroluminescent display device free from the above problems and disadvantages.

SUMMARY OF THE INVENTION

Accordingly, it is an object of the present invention to provide a novel organic electroluminescent display device free from the above problems.

It is a further object of the present invention to provide a novel organic electroluminescent display device free from any damage of an organic electroluminescent layer.

It is a still further object of the present invention to provide a novel organic electroluminescent display device free from any deterioration of an organic electroluminescent layer.

It is yet a further object of the present invention to provide a novel organic electroluminescent display device allowing a easy fine patterning to a cathode.

It is a further more object of the present invention to provide a novel organic electroluminescent display device allowed to be manufactured at a lost cost.

It is still more object of the present invention to provide a novel organic electroluminescent display device allowed to be manufactured at a lost cost.

It is moreover object of the present invention to provide a novel organic electroluminescent display device allowing any desired patterning to the cathode.

The above and other objects, features and advantages of the present invention will be apparent from the following descriptions.

A novel organic electroluminescent display device comprising a transparent supporting substrate, a transparent anode of a plurality of stripes provided on the transparent supporting substrate, an organic electroluminescent layer extending over the transparent supporting substrate and the transparent anode, and a cathode of a plurality of stripes which extend in a direction perpendicular to a direction along which the stripes of the anode extend, wherein at least an insulative separation wall is provided between the stripes of the anode and the insulative separation wall has a height which is higher than a sum of a thickness of the anode and a thickness of the organic electroluminescent layer and further wherein the organic electroluminescent layer also extends over the insulative separation wall.

BRIEF DESCRIPTION OF THE DRAWINGS

Preferred embodiments according to the present invention will be described in detail with reference to the accompanying drawings.

DISCLOSURE OF THE INVENTION

Figure 1:
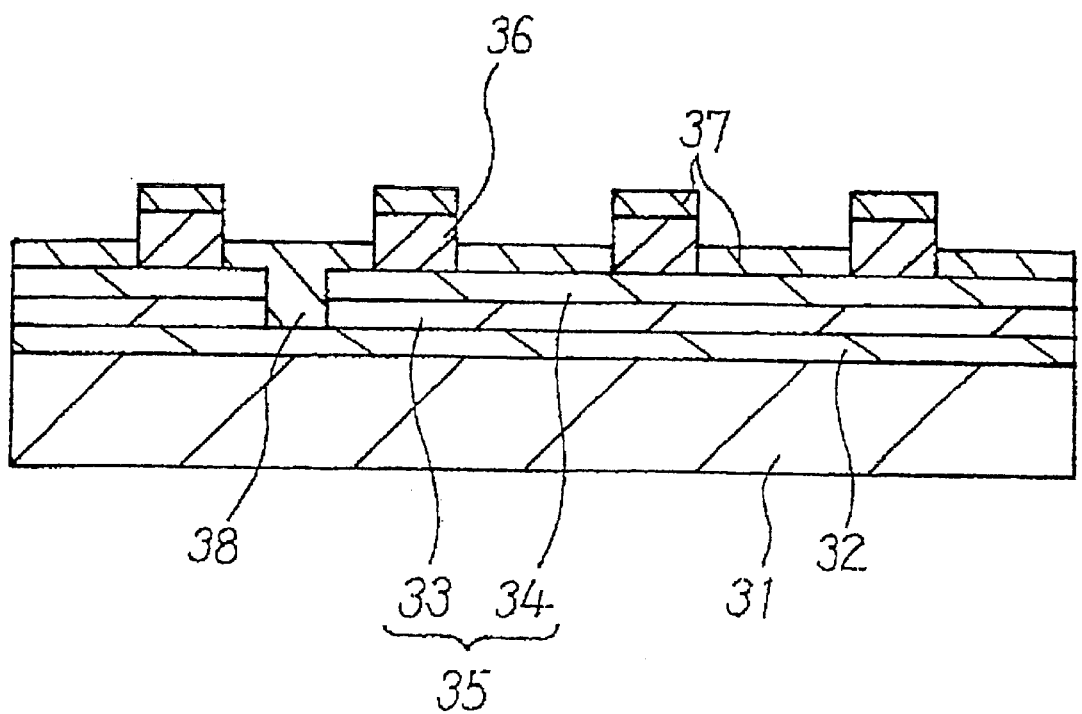
FIG. 1 is a fragmentary cross sectional elevation view illustrative of a conventional organic electroluminescent display device.

A novel organic electroluminescent display device comprising a transparent supporting substrate, a transparent anode of a plurality of stripes provided on the transparent supporting substrate, an organic electroluminescent layer extending over the transparent supporting substrate and the transparent anode, and a cathode of a plurality of stripes which extend in a direction perpendicular to a direction along which the stripes of the anode extend, wherein at least an insulative separation wall is provided between the stripes of the anode and the insulative separation wall has a height which is higher than a sum of a thickness of the anode and a thickness of the organic electroluminescent layer and further wherein the organic electroluminescent layer also extends over the insulative separation wall.

The insulative isolation wall may comprise a plurality of stripes, each of which continuously extends over the transparent supporting substrate in a parallel direction to the stripes of the anode so that the stripes of the insulative isolation wall are extend between the stripes of the anode.

Alternatively, the insulative isolation wall may comprise a plurality of stripes, each of which further comprises a plurality of segments separated by gaps and aligned over the transparent supporting substrate in a parallel direction to the stripes of the anode so that the discontinuous stripes of the insulative isolation wall are extend between the stripes of the anode. In this case, the width and the position of the gaps between the segments should be noted so that a shape of the cathode is kept to be uniform. The width of the gaps between the segments should be narrower than a width of a stripe-shaped shielding portion of the shadow mask so as to avoid the gaps from extending to stripe slits of the shadow mask.

The height of the separation walls is not limitative unless the shadow mask having been placed over side walls is in contact with the organic electroluminescent layer on the anode.

The organic electroluminescent layer should cover at least the anode. It is, however, preferable that the organic electroluminescent layer covers the separation walls and the anodes as well as extends over an entire region of the transparent supporting substrate. It is also possible that the organic electroluminescent layer covers only the separation walls and the anode but not covers boundary portions between the separation walls and the anode.

The present invention also provides a method of forming a novel organic electroluminescent display device which comprises the following steps. A transparent anode of a plurality of stripes patterned is formed on a transparent supporting substrate. A plurality of separation walls are provided between the stripes of the anode and over the transparent supporting substrate wherein the separation walls have a height which is higher than a sum of a thickness of the anode and a predetermined value. An organic electroluminescent layer having a thickness corresponding to the above predetermined value is formed over the anode and the separation walls. A shadow mask having a large number of slits is placed on and in securely contact with top surfaces of the separation walls so that a metal material is evaporated through the shadow mask to selectively form a cathode of a plurality of stripes over the organic electroluminescent layer.

The shadow mask has a cathode pattern.

It is preferable that the shadow mask has a large number of stripe-shaped openings, each of which extends continuously over the substrate.

It is also preferable that the shadow mask has a large number of stripe-shaped openings, each of which comprises a plurality of segments separated by gaps and aligned over the substrate.

It is also an effective way to use the shadow mask with a magnetic field generator which generates a magnetic field for forcing the shadow mask in contact securely with the tops of the separation walls whereby the degree of fitness of the shadow mask onto the separation walls. This makes it easy to form a fine and accurate pattern. The magnetic field generator may comprise either a permanent magnet or an electromagnet.

In the Japanese laid-open patent publication No. 8-171989, it is disclosed that separation walls are formed between stripes of an anode and over a transparent supporting substrate and then an organic electroluminescent layer is laminated thereon. A cathode of stripe type is then laminated over the organic electroluminescent layer. This conventional organic electroluminescent display is different from the novel organic electroluminescent display device in that the height of the separation walls is almost the same as the thickness of the anode, for which reason when the cathode is formed, the shadow mask might be made into contact with the organic electroluminescent layer whereby the organic electroluminescent layer might receive a damage or a scratch.

By contrast to the above conventional organic electroluminescent display device, the novel organic electroluminescent display device in accordance with the present invention is free from the above problem because the separation walls have a height which is higher than the sum of the anode thickness and the thickness of the organic electroluminescent layer so that the top of the separation walls has a higher level than the top of the organic electroluminescent layer over the anode. This means that the shadow mask is made into securely contact with and is supported by only the separation walls. This structural feature keeps the organic electroluminescent layer from contact with the shadow mask whereby the organic electroluminescent layer receives no damages nor scratches from the shadow mask.

Further, the shadow mask is made into securely contact with the separation walls, for which reason even an evaporation of a metal for cathode is isotropic for forming the cathode, an accurately patterned cathode can be obtained.

Furthermore, the present invention uses no wet etching technique with a photo-resist for patterning the cathode, for which reason the present invention is free from the above problem with any moisture infiltration onto an interface between the organic electroluminescent layer and the cathode, whereby the luminescent property and the life time of the novel organic electroluminescent display in accordance with the present invention are free of deterioration. The present invention allows the novel organic electroluminescent display to be superior in luminescent property and life time.

In accordance with the present invention, the separation walls are formed along the stripes of the anode so that the stripes of the walls extend in a direction perpendicular to the direction along which the stripes of the cathode extend whereby the stripes of the walls cross at the right angle to the stripe slits of the shadow mask. This allows the shadow mask to easily be placed on the separation walls without any special alignment technique.

In contrast to the present invention, in the prior art as disclosed in Japanese laid-open patent publication No. 5-275172, the separation walls are formed over the anode but so that the stripes of the separation walls extend in a direction perpendicular to the direction along which the stripes of the anode extend. In this case, in order to obtain an accurate pattern of the cathode, it is required that the thickness of the separation walls is thinner than a width of the stripe shielding portions o the shadow mask. Further accurate adjustments in thickness of the separation walls and in distance between the adjacent walls are required. Further more, the stripe shielding portions of the shadow mask is required to be placed accurately over the separation walls so that no portions of the separation walls extend to the stripe slits of the shadow mask. Those mean that it is difficult to obtain a fine and accurate pattern of the cathode. In the light of the above descriptions, the conventional organic electroluminescent display is disadvantageous. It is therefore preferable that the separation walls are so formed that the stripes of the separation walls extend in a direction perpendicular to the direction along which the stripes of the cathode extend.

PREFERRED EMBODIMENTS

First Embodiment

Figure 2:
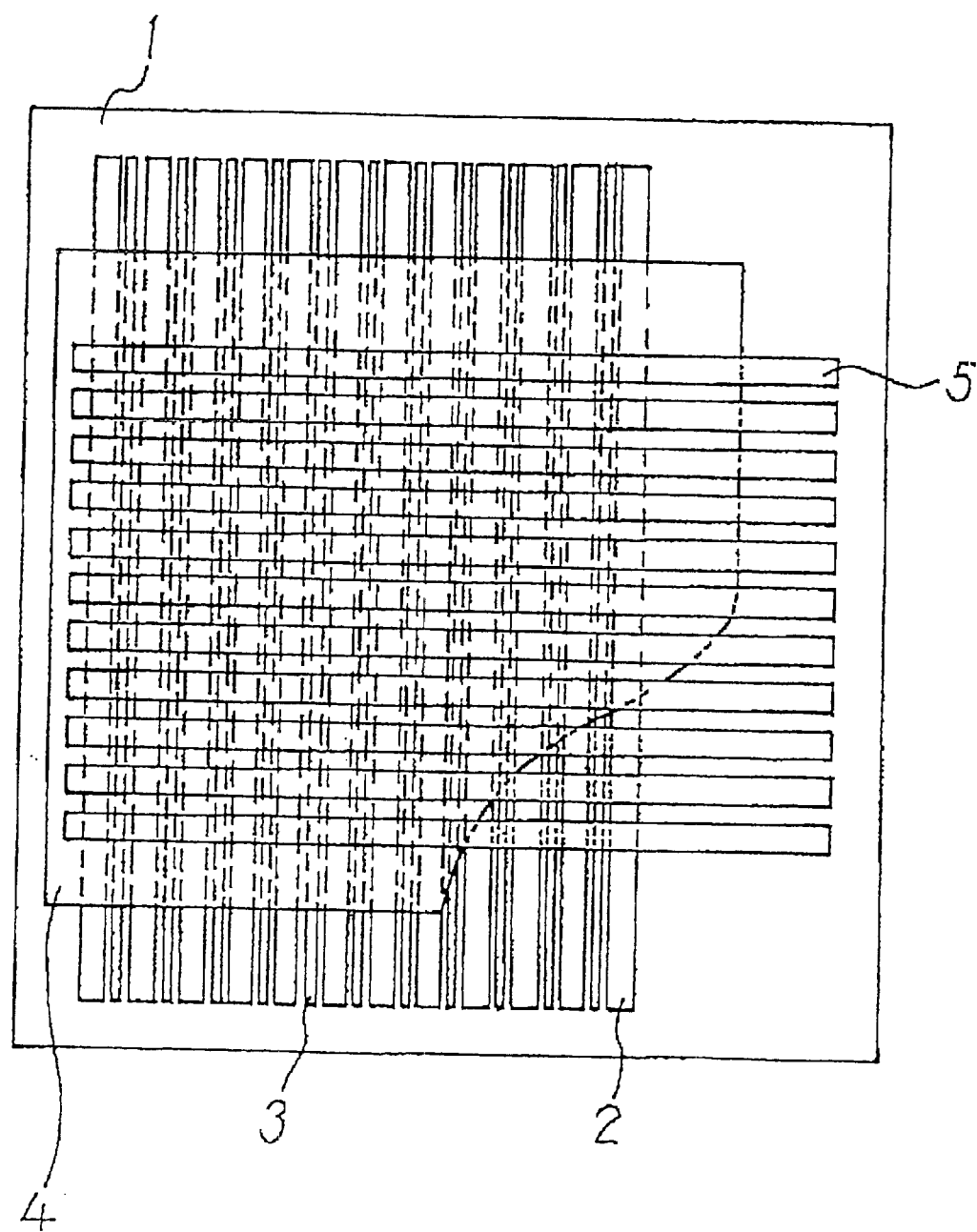
FIG. 2 is a plane view illustrative of a novel organic electroluminescent display in a first embodiment in accordance with the present invention.

A first embodiment according to the present invention will be described in detail with reference to FIG. 2 which is a plane view illustrative of a novel organic electroluminescent display. An indium tin oxide film having a thickness of 100 nanometers is deposited on a transparent supporting substrate 1 by a sputtering method. The transparent supporting substrate 1 may comprise a glass substrate. For example, no-alkali glass substrate is preferable because of poor moisture absorption property. A cheep low alkali glass substrate or a soda lime glass substrate are also available by keeping the substrate in dry condition.

The indium tin oxide film deposited on the glass substrate is then patterned by photo-lithography technique for etching process to form stripes of the indium tin oxide film which serves as anode 2. The stripes of the anode 2 extend in a vertical direction and aligned in a lateral direction at a constant pitch. The indium tin oxide film not only serves as the anode 2 but allows transmission of a light having been emitted from an organic electroluminescent layer, for which reason a low resistance and a high light transmittance are preferable. The anode 2 comprises 128 stripe lines having a line pitch of 1.0 millimeter, a line width of 0.6 millimeters, and a length of 45 millimeters. The stripe lines of the anode 2 extend in column direction of the display device.

Separation walls 3 in the shape of stripe lines are formed between the stripe lines of the anode 2 and over the glass substrate 1. The stripe lines of the separation walls 3 extend in the column direction or in parallel to the stripe lines of the anode 2. The pattern of the stripe lines of the separation walls 3 has a pitch of 1.0 millimeter and a width of 0.3 millimeters. The separation walls 3 have a height in the range of 15–25 micrometers.

An organic electroluminescent layer 4 is deposited by a vacuum evaporator over the glass substrate so that the organic electroluminescent layer 4 is in the shape of rectangle or square, whereby the organic electroluminescent layer 4 cover the anode 2 and the separation walls 3. Then, A shadow mask is provided which has slender stripe shielding portions extending in a direction perpendicular to the directions of the stripe lines of the walls extend. By use of the shadow mask, a metal is vacuum-evaporated to form a cathode 5 of stripe lines over the organic electroluminescent layer 4.

The following description will highlight fabrication processes for the novel organic electroluminescent display device in the first embodiment according to the present invention with reference to FIGS. 3A through 3F are fragmentary cross sectional elevation views illustrative of sequential processes involved in a novel method of forming the novel organic electroluminescent displays.

Figure 3A:
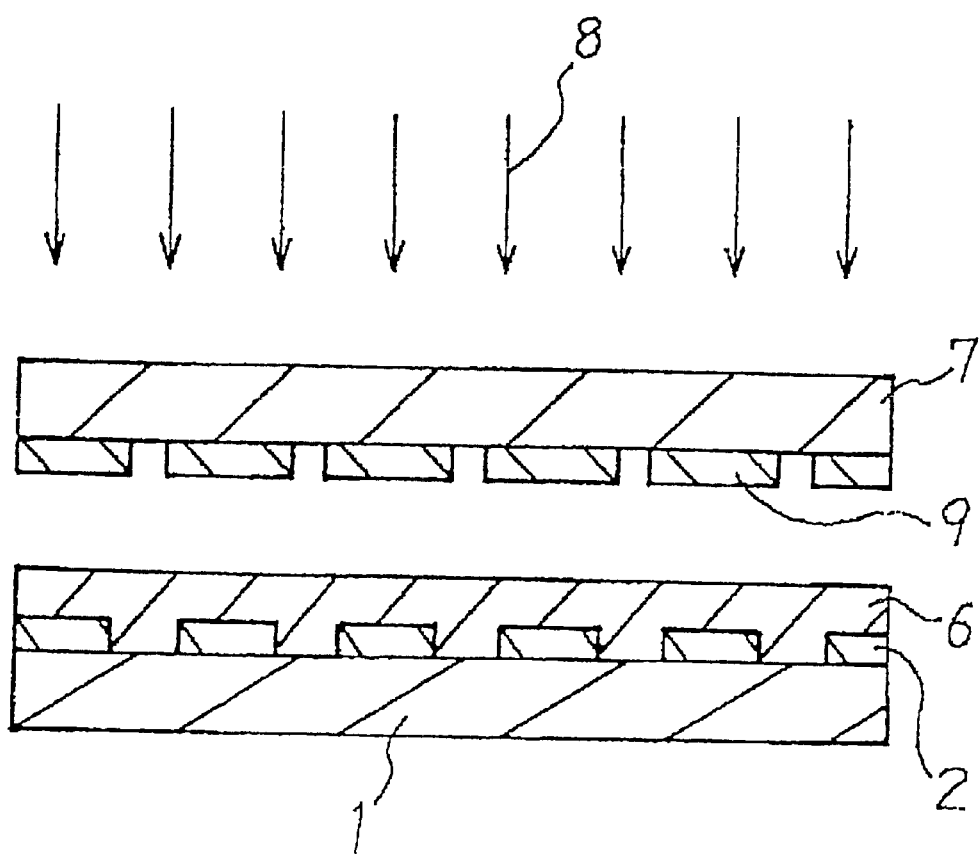
FIGS. 3A through 3F are fragmentary cross sectional elevation views illustrative of sequential processes involved in a novel method of forming a novel organic electroluminescent displays in a first embodiment in accordance with the present invention.

With reference to FIG. 3A, an indium tin oxide film is deposited by a vacuum evaporation on a transparent glass substrate 1. The indium tin oxide film is then patterned by a photo-lithography technique to form an anode of a large number of stripe lines which extend in parallel to each other. A negative dry film resist 6 is adhered over the glass substrate 1 and the anode 2 by a laminator. A photo-mask 7 is used so that a near ultraviolet ray 8 is irradiated from an exposure system through the photo-mask 7 onto the dry film resist 6 over the glass substrate 1 so that a stripe pattern is transferred onto the dry film resist 6. The dry film resist 6 is commercially available from Tokyo Applied Industry Co. alpha-450. The lamination of the dry film resist 6 is carried out at a temperature in the range of 85–115° C. under a pressure in the range of 2–4 Kg/cm$^2$ at a rate of 1–3 mm/min. The photo-mask 7 has an optical shielding pattern 9 which comprises 31 stripe lines of 0.3 millimeters in width and aligned at a pitch of 1.0 millimeter. The photo-mask 7 is so positioned in a space over the dry film pattern 6 that 31 stripe lines of the optical shielding pattern 9 extend in parallel to the stripe lines of the anode 2. Sufficiently wide optical shielding patterns are placed outside the opposite end two stripe lines of the optical shielding pattern 9 at a distance of 0.6 millimeters therefrom.

The above irradiation of the near ultraviolet ray onto the dry film resist 6 causes the exposed region of the dry film resist 6 to show cross-linking reaction and becomes insoluble, whilst unexposed regions of the dry film resist 6 are then developed by use of a solution containing 0.8–1.2% of $Na_2Co_3$ and subsequently cleaned for selective releasing thereof by use of a solution of 2–4% KOH. For the development and subsequent cleaning processes, the glass substrate 1 is so placed that the dry film resist 6 faces downwardly and the glass substrate 1 is rotated at 4000 rpm during which the solutions of the developing solution and releasing solution. Are sprayed onto the dry film 6. After the selectively release of the unexposed parts of the dry film resist 6, the glass substrate 1 is dried in a clean oven at a temperature of 130° C. for 60 minutes during which the glass substrate 1 is rotated at 3000 rpm for 60 minutes.

Figure 3B:
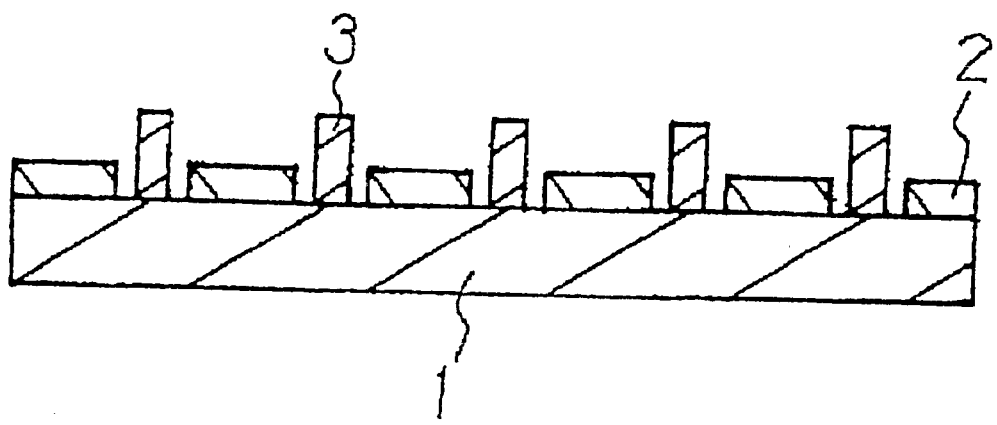

With reference to FIG. 3B, as described above, the dry film resist 6 remains over the glass substrate 1 and between the stripe lines of the anode 2. The dry film resist comprises patterned stripe lines which extend between the stripe lines of the anode 2 and over the glass substrate 1 in a direction parallel to the stripe lines of the anode 2. The stripe lines of the patterned dry film resist 6 serve as separation walls 3. Namely, the separation walls 3 are formed comprising the stripe lines which extend between the stripe lines of the anode 2 and over the glass substrate 1. It s important that the thickness of the dry film resist 6 or the height of the separation walls 3 is required to be higher or larger than a sum of the thickness of the anode and a predetermined value corresponding to a thickness of the organic electroluminescent layer which will be formed in a later process so as to keep the organic electroluminescent layer to be distanced from a shadow mask placed on the separation walls wherein the shadow mask cover the organic electroluminescent layer. In consideration of patterning to aluminum interconnections for cathode, the thickness of the dry film resist 6 or the height of the separation walls 3 is preferably 10–25 micrometers.

Figure 3C:
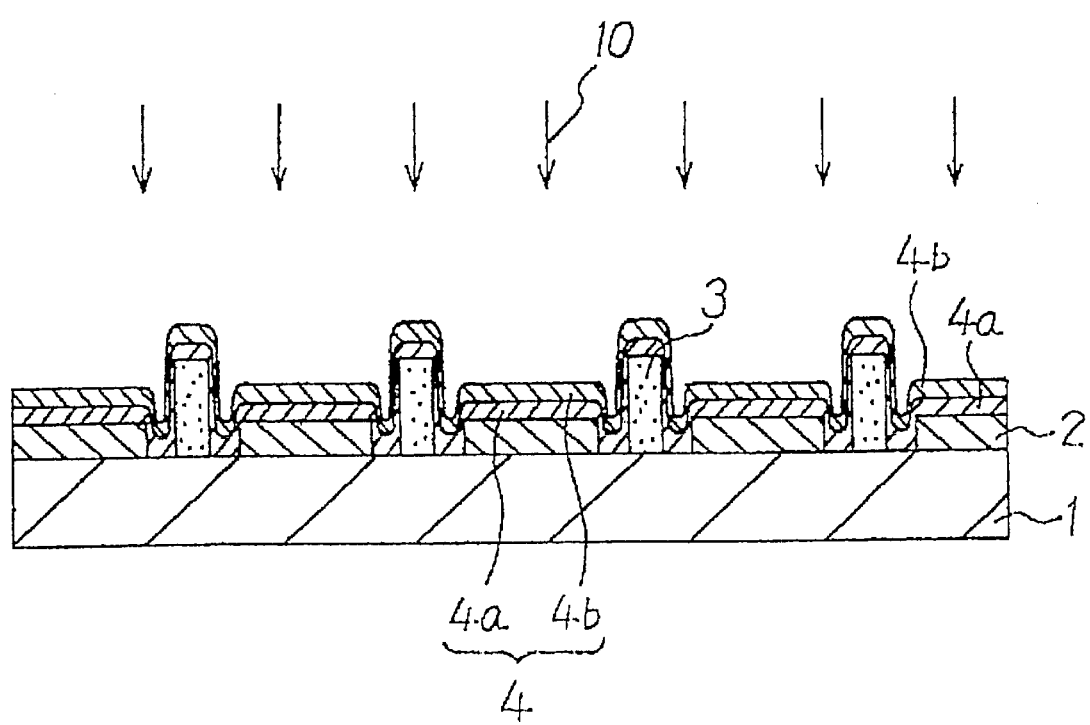

With reference to FIG. 3C, the glass substrate 1 is held by a substrate holder in a vacuum evaporator so that the separation walls face downwardly. N,N'-diphenyl-N,N'bis(α-naphthyl)-1,1'-biphenyl-4,4'-diamin (hereinafter referred to as into α-NPD is supplied into a resistance-heating board of the vacuum evaporator. Into the other resistance-heat board, supplied is a tris(8-quinolight)aluminum complex (hereinafter referred to as $Alq_3$). The vacuum evaporator is vacuumed to $1\times10^{-5}$ Torr or less by a vacuum pump.

A metal mask is prepared which has a rectangular or square shaped opening. The metal mask is placed over the glass substrate 1 having the separation walls 3 so that a current is applied between the glass substrate 1 and the resistance-heating board placed under the metal mask to heat the substrate 1 with the α-NPD resistance-heating board so as to evaporate an α-NPD layer 4a of about 50 nanometers in thickness entirely over the glass substrate 1, the anode 2 and the separation walls 3. Thereafter, a current is applied to the resistance-heating board containing $Alq_3$ so that an $Alq_3$ layer 4b of 50 nanometers in thickness is formed on the α-NPD layer 4a. As a result, an organic electroluminescent layer 4 is formed which comprises laminations of the α-NPD layer 4a and the $Alq_3$ layer 4b. The α-NPD layer 4a serves as a hole transport layer whilst the $Alq_3$ layer 4b serves as an electron transport layer and a light-emitting layer.

The above vacuum evaporation is preferably carried out in a direction vertical to a surface of the substrate so as to form no shadow portion by shielding the separation walls and also the substrate 1 is rotated in a plane parallel to the surface of the substrate 1 so that the deposition of the organic molecules can be uniformed.

Figure 4:
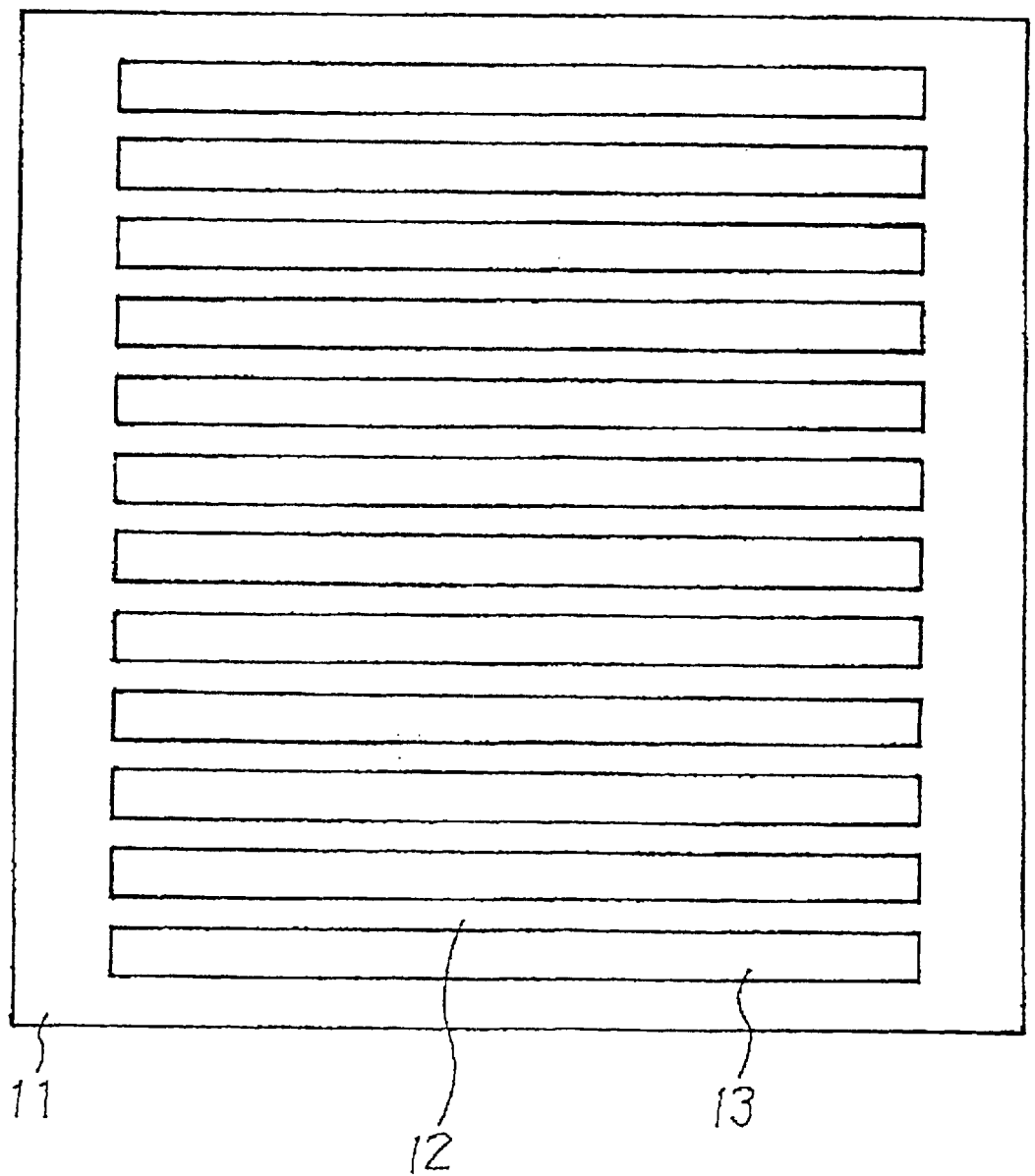
FIG. 4 is a plane view illustrative of a shadow mask to be used for forming a novel organic electroluminescent displays in accordance with the present invention.

A shadow mask 11 of SUS430 shown in FIG. 4 has previously be placed in the vacuum evaporator before the glass substrate 1 formed with the organic electroluminescent layer 4 is placed on the shadow mask 11.

The shadow mask 11 has 32 stripe shielding portions 12 and stripe slits 13 defined by the stripe shielding portions 12. The substrate 1 is so placed that the direction along which the stripe shielding portions 12 extend is perpendicular to the direction along which the stripe lines of the separation walls 3 over the substrate 1. The stripe shielding portions 12 of the shadow mask 11 has a thickness of 0.4 millimeters, a width of 0.4 millimeters and a length of 130 millimeters. The stripe shielding portions 12 are aligned at a center pitch of 1.0 millimeter.

Figure 3D:
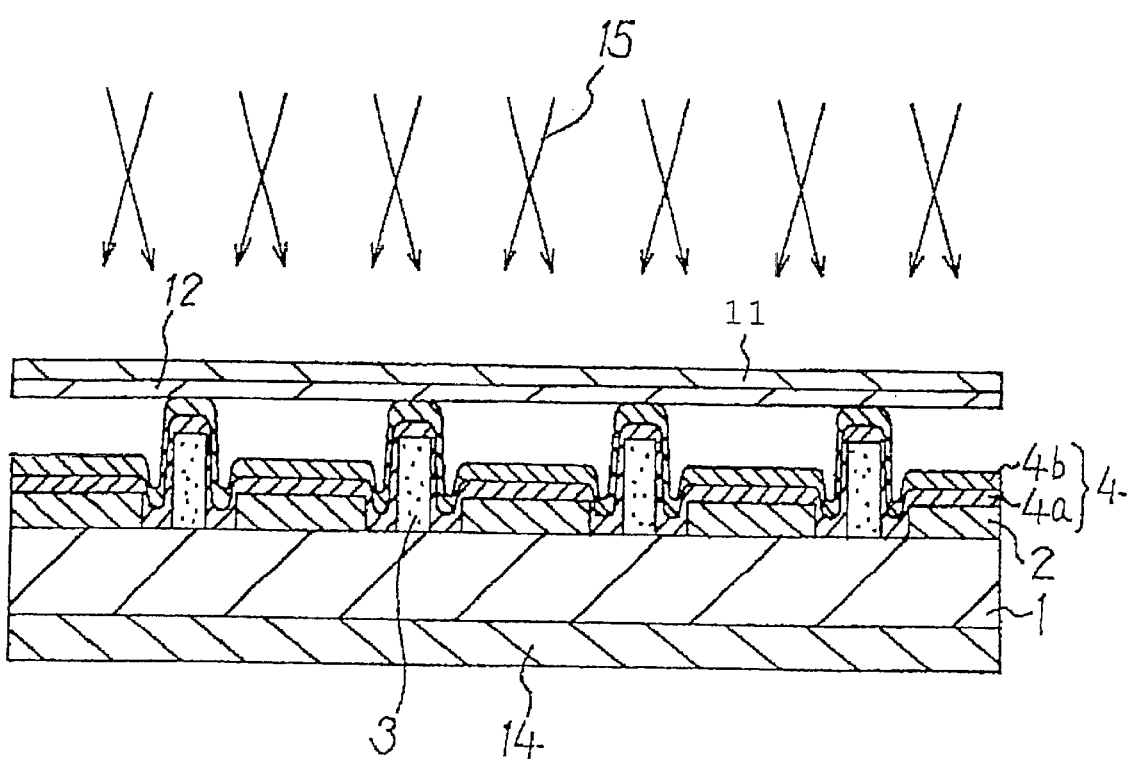

With reference to FIG. 3D, a magnet 14 is provided on an opposite surface o the substrate 1 to the surface on which the anode 2, the separation walls 3 and the organic electroluminescent layer 4 are provided, so that the magnet 14 faces the metal shadow mask 11 to be attracted to the separation walls 3. As a result, the stripe shielding portions 12 of the shadow mask 11 are made into securely contact with the tops of the separation walls 3. The shadow mask 11 is made of a magnetic material.

Magnesium is supplied into the resistance-heating board in the vacuum evaporator whilst silver is supplied into the other resistance-heating board. Magnesium and silver are concurrently evaporated at evaporations rates such that a ratio of magnesium to silver is 10:1. Evaporation direction of metals through the shadow mask onto the organic electroluminescent layer 4 is almost vertical to the surface of the substrate 1 and also almost isotropic. It is preferable that the substrate 1 is kept to rotate during the evaporation processes. Magnesium and silver are deposited through the stripe slits of the shadow mask 11 onto the selected regions under the stripe slits whilst no magnesium and no silver are deposited under the stripe shielding portions 12 of the shadow mask 11.

Figure 3E:
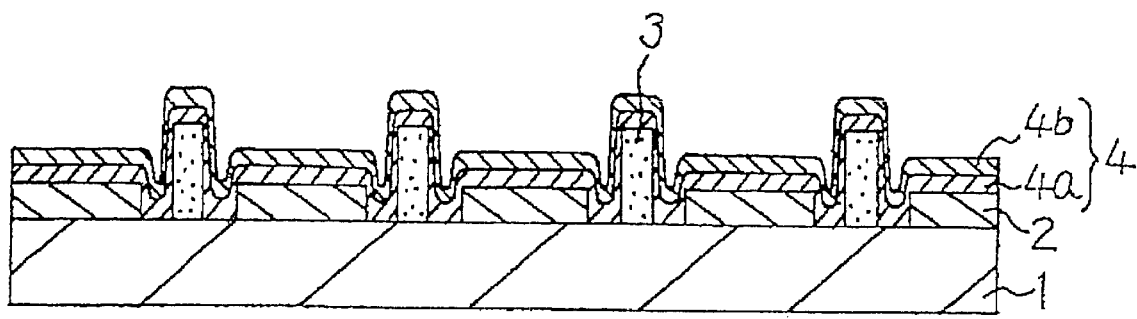

With reference to FIG. 3E, a magnesium-silver alloy metal layer is formed which extends over the separation walls 3, the organic electroluminescent layer 4 and the stripe shielding portions 12 of the shadow mask 11 but only regions under the stripe slits of the shadow mask 11 whilst no magnesium-silver alloy metal layer is formed under the stripe shielding portions 12 of the shadow mask 11. A magnesium-silver alloy metal layer has a thickness of about 200 nanometers. The substrate 1 is removed from the shadow mask 11.

Figure 3F:
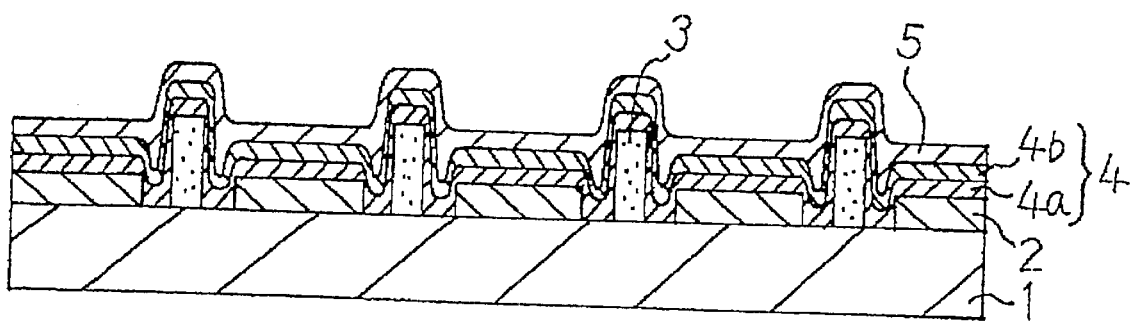

With reference to FIG. 3F. the magnesium-silver alloy metal layer serves as a cathode 5. The cathode 5 comprises 32 row stripe lines which extend in a direction perpendicular to the direction along which the stripe lines of the anode 2 extend. As a result, the organic electroluminescent display is formed which has the anode 2 of column stripe lines and separation walls 3 of column stripe lines as well as the cathode 5 of row stripe lines.

As described above, the shadow mask is placed on the separation walls 3 so that the organic electroluminescent layer 4 is kept distanced from the shadow mask, for which reason the organic electroluminescent layer 4 is free from any damage or scratch by contacting with the shadow mask.

The organic electroluminescent display is driven by applying a pulse voltage signal of 8V to the cathode so that a time-division canning to the cathode is carried out at a duty factor of 1/32 and a frame frequency of 150 Hz, wherein non-selected cathodes are applied with +8V whilst the selected cathode is applied with 0V.

On the other hand, a pulse current of 300 mA/cm2 with a maximum voltage of 8V is applied from a constant current generator to a selected one or more stripe lines of the anode 2 connected to pixels which are intended to be light ON, whilst zero voltage is applied to the non-selected stripe lines of the anode 2 connected to the remaining pixels which are intended to be light OFF. As a result, the display shows a desired display pattern of a pixel brightness of 600 $cd/cm^2$.

Figure 5:
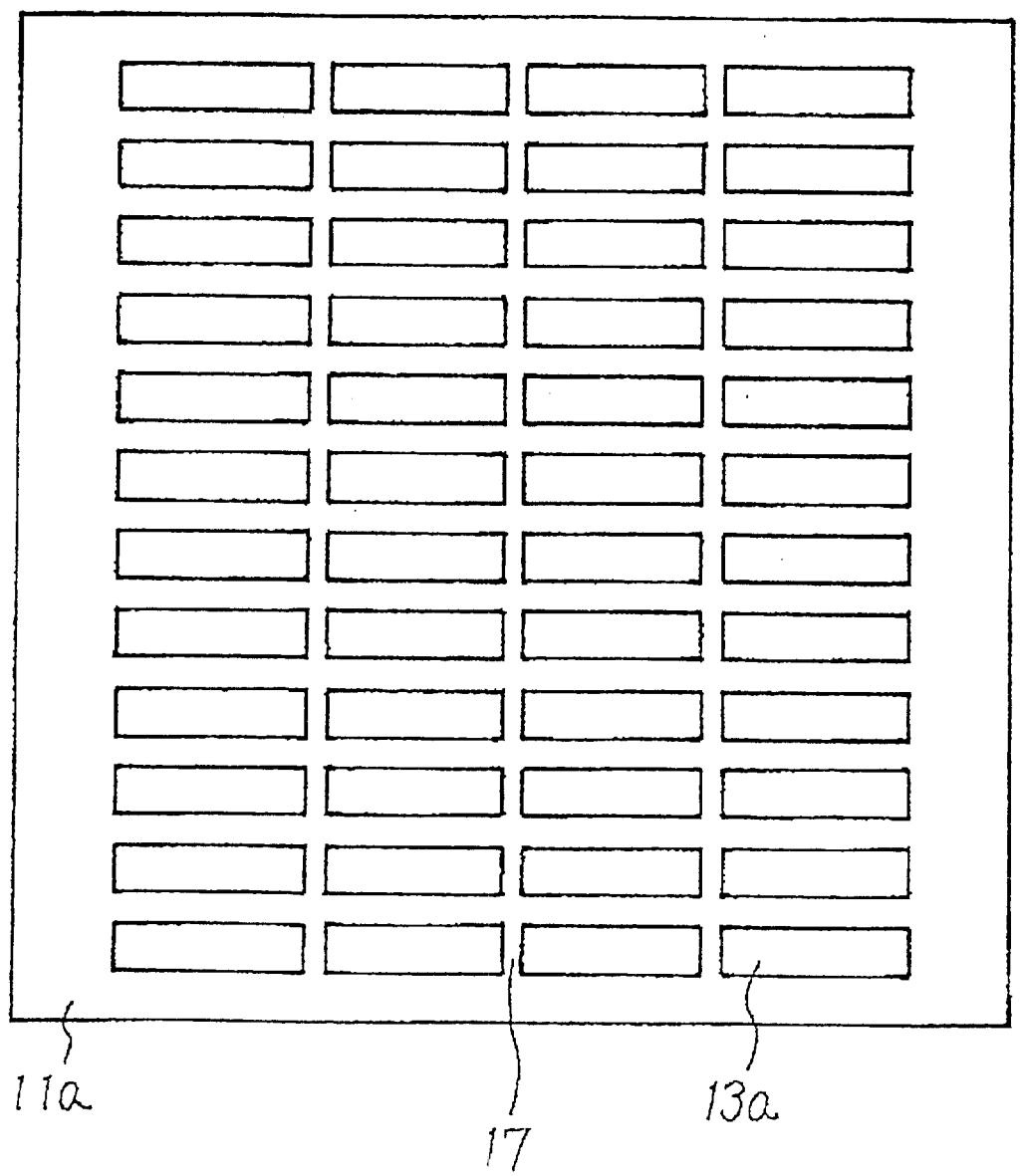
FIG. 5 is a plane view illustrative of another shadow mask to be used for forming a novel organic electroluminescent displays in accordance with the present invention.

Various shadow masks are available other than one shown in FIG. 4. For example, the shadow mask of FIG. 5 is available. The shadow mask 11a of FIG. 5 has stripe lines extending in parallel to each other wherein each the stripe line comprises segments 13a aligned and separated by bridge portions 17 so that the segments 13a are aligned in matrix over the substrate 1, In place of the above shadow mask 11, this shadow mask 11a can be used. Since the separation walls 3 have a height of 10–25 micrometers, the bridge portions 17 of the shadow mask 11a do not prevent the necessary evaporations of metal because the evaporation direction is ranged in an angle so that metals are deposited at a small oblique angle. Since the thickness of the organic electroluminescent layer 4 is less than 1 micrometer, the a distance from the surface of the organic electroluminescent layer 4 to the surface of the shadow mask 11a is about 10–25 micrometers. For causing the rotation of the substrate 1 in a plane parallel o the surface of the substrate 1 in the vacuum evaporator, the evaporator is so designed that the metals are evaporated in such a direction as to ensure an injection angle of not less than 15 degrees, for which reason the metals can be deposited under the bridge portions 17 of the shadow mask 11a even each the bridge portions 17 has a width of 20 micrometers.

As illustrated in FIG. 5, the shadow mask 11a has a mesh structure of the bridge portions 17 which support the stripe slits. This structure provides such a mechanical strength as to reduce a thickness of the shadow mask to 50 micrometers. The width of the bridge portions 17 of the shadow mask 11a, the height of the separation walls and the thickness of the shadow mask 11a are determined in consideration of the injection angle and the mechanical strength of the shadow mask. In the light of the mechanical strength of the shadow mask, the thickness of the shadow mask 11a is preferable not less than 50 micrometers. In this case, the width of the bridge portions 17 of the shadow mask 11a is preferably about 20 micrometers. The height of the separation walls 3 is preferably in the range of 10–25 micrometers.

As described above, in accordance with the present invention, separation walls 3 of stripe lines are provided between the stripe lines of the anode 2 and over the substrate 1 before the organic electroluminescent layer 4 is formed and subsequently the shadow mask is placed on the separation walls wherein the shadow mask 11 is kept distanced from the organic electroluminescent layer 4. By use of the shadow mask 11, metals are evaporated to form the cathode 5. Since the organic electroluminescent layer 4 is free from any damage or scratch by contacting with the shadow mask 11, there is no possibility of formation of short circuit between the anode and cathode whereby the yield of the organic electroluminescent display can remarkable be increased.

It is also possible to form any desirable cathode patterns by selecting the height of the separation walls.

The rotation of the substrate 1 allows an effective use of the evaporation source and allows a uniform evaporation entirely over the substrate 1. This may reduce the size of the vacuum evaporator.

Second Embodiment

A second embodiment according to the present invention will be described in detail. An indium tin oxide film having a thickness of 100 nanometers is deposited on a transparent supporting substrate 1 by a sputtering method. The transparent supporting substrate 1 may comprise a glass substrate. For example, no-alkali glass substrate is preferable because of poor moisture absorption property. A cheep low alkali glass substrate or a soda lime glass substrate are also available by keeping the substrate in dry condition.

The indium tin oxide film deposited on the glass substrate is then patterned by photo-lithography technique for etching process to form stripes of the indium tin oxide film which serves as anode 18. The stripes of the anode 18 extend in a vertical direction and aligned in a lateral direction at a constant pitch. The indium tin oxide film not only serves as the anode 18 but allows transmission of a light having been emitted from an organic electroluminescent layer, for which reason a low resistance and a high light transmittance are preferable. The anode 18 comprises 256 stripe lines having a line pitch of 0.35 millimeters, a line width of 0.25 millimeters, and a length of 29 millimeters. The stripe lines of the anode 18 extend in column direction of the display device.

Separation walls 3 in the shape of stripe lines are formed between the stripe lines of the anode 18 and over the glass substrate 1. The stripe lines of the separation walls 3 extend in the column direction or in parallel to the stripe lines of the anode 18. The pattern of the stripe lines of the separation walls 3 has a pitch of 0.35 millimeters and a width of 0.1 millimeters. The separation walls 3 have a height in the range of 10–25 micrometers.

An organic electroluminescent layer 4 is deposited by a vacuum evaporator over the glass substrate so that the organic electroluminescent layer 4 is in the shape of rectangle or square, whereby the organic electroluminescent layer 4 covers the anode 18 and the separation walls 3. Then, a shadow mask is provided which has slender stripe shielding portions extending in a direction perpendicular to the directions of the stripe lines of the walls extend. By use of the shadow mask, a metal is vacuum-evaporated to form a cathode 5 of stripe lines over the organic electroluminescent layer 4.

Figure 6A:
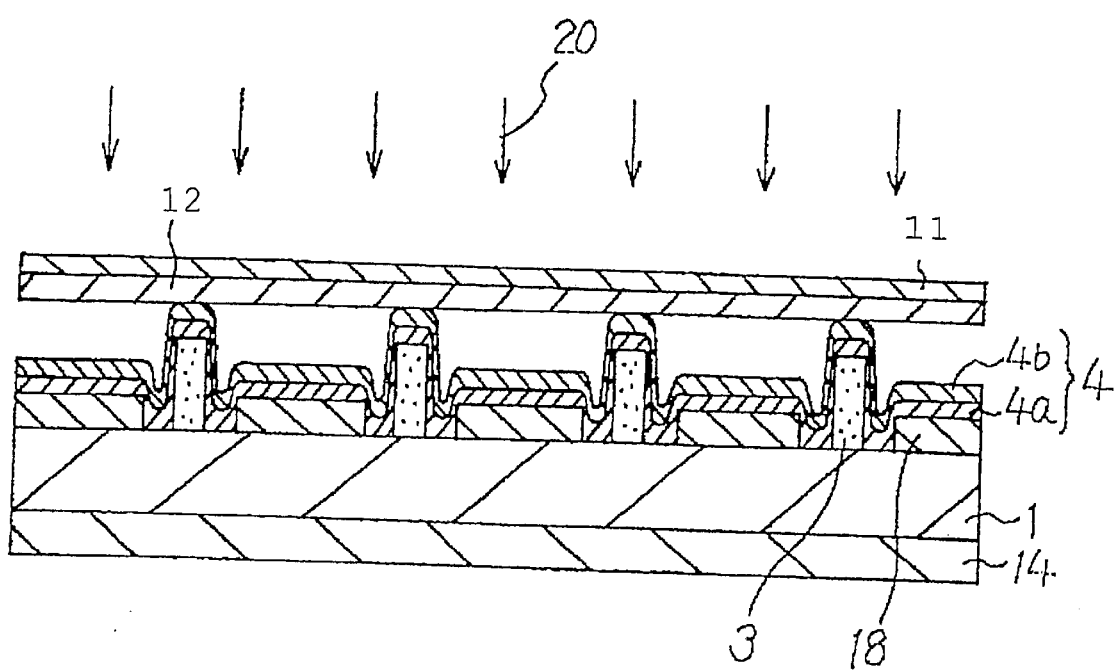
FIGS. 6A through 6B are fragmentary cross sectional elevation views illustrative of sequential processes involved in a novel method of forming a novel organic electroluminescent displays in a second embodiment in accordance with the present invention.
Figure 6B:
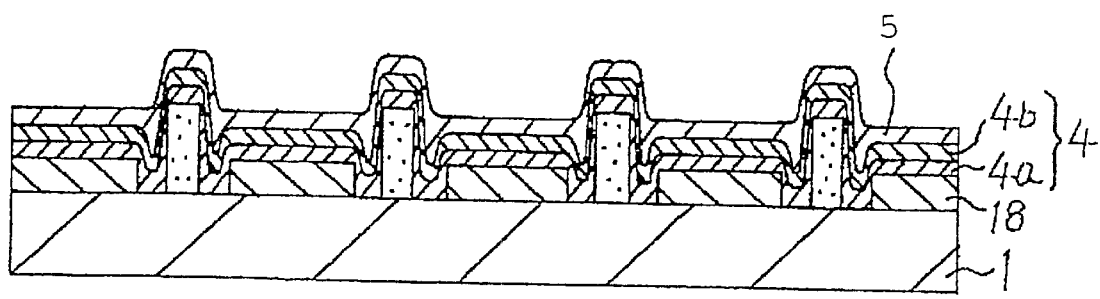

The following description will highlight fabrication processes for the novel organic electroluminescent display device in the second embodiment according to the present invention with reference to FIGS. 6A through 6B are fragmentary cross sectional elevation views illustrative of sequential processes involved in a novel method of forming a novel organic electroluminescent displays.

With reference to FIG. 6A, an indium tin oxide film is deposited by a vacuum evaporation on a transparent glass substrate 1. The indium tin oxide film is then patterned by a photo-lithography technique to form an anode of a large number of stripe lines which extend in parallel to each other. A negative dry film resist 6 is adhered over the glass substrate 1 and the anode 18 by a laminator. A photo-mask 7 is used so that a near ultraviolet ray 8 is irradiated from an exposure system through the photo-mask 7 onto the dry film resist 6 over the glass substrate 1 so that a stripe pattern is transferred onto the dry film resist 6. The dry film resist 6 is commercially available from Tokyo Applied Industry Co. alpha-450. The lamination of the dry film resist 6 is carried out at a temperature in the range of 85–115° C. under a pressure in the range of 2–4 Kg/cm$^2$ at a rate of 1–3 mm/min. The photo-mask 7 has an optical shielding pattern 9 which comprises 31 stripe lines of 0.3 millimeters in width and aligned at a pitch of 1.0 millimeter. The photo-mask 7 is so positioned in a space over the dry film pattern 6 that 31 stripe lines of the optical shielding pattern 9 extend in parallel to the stripe lines of the anode 18. Sufficiently wide optical shielding patterns are placed outside the opposite end two stripe lines of the optical shielding pattern 9 at a distance of 0.6 millimeters therefrom.

The above irradiation of the near ultraviolet ray onto the dry film resist 6 causes the exposed region of the dry film resist 6 to show cross-linking reaction and becomes insoluble, whilst unexposed regions of the dry film resist 6 are then developed by use of a solution containing 0.8–1.2% of $Na_2Co_3$ and subsequently cleaned for selective releasing thereof by use of a solution of 2–4% KOH. For the development and subsequent cleaning processes, the glass substrate 1 is so placed that the dry film resist 6 faces downwardly and the glass substrate 1 is rotated at 4000 rpm during which the solutions of the developing solution and releasing solution. Are sprayed onto the dry film 6. After the selectively release of the unexposed parts of the dry film resist 6, the glass substrate 1 is dried in a clean oven at a temperature of 130° C. for 60 minutes during which the glass substrate 1 is rotated at 3000 rpm for 60 minutes.

The dry film resist 6 remains over the glass substrate 1 and between the stripe lines of the anode 18. The dry film resist comprises 63 stripe lines which extend between the stripe lines of the anode 18 and over the glass substrate 1 in a direction parallel to the stripe lines of the anode 18. The stripe lines of the patterned dry film resist 6 serve as separation walls 3. Namely, the separation walls 3 are formed comprising the stripe lines which extend between the stripe lines of the anode 18 and over the glass substrate 1. It s important that the thickness of the dry film resist 6 or the height of the separation walls 3 is required to be higher or larger than a sum of the thickness of the anode and a predetermined value corresponding to a thickness of the organic electroluminescent layer which will be formed in a later process so as to keep the organic electroluminescent layer to be distanced from a shadow mask placed on the separation walls wherein the shadow mask cover the organic electroluminescent layer. In consideration of patterning to aluminum interconnections for cathode, the thickness of the dry film resist 6 or the height of the separation walls 3 is preferably 10–25 micrometers. A width of the stripe lines of the separation walls 3 is 0.1 millimeter and the stripe lines of the separation walls 3 are aligned at a pitch of 0.35 millimeters.

The glass substrate 1 is held by a substrate holder in a vacuum evaporator so that the separation walls face downwardly. N,N'-diphenyl-N,N'bis($\alpha$-naphthyl)-1,1'-biphenyl-4,4'-diamin (hereinafter referred to as into $\alpha$-NPD is supplied into a resistance-heating board of the vacuum evaporator. Into the other resistance-heat board, supplied is a tris(8-quinolight)aluminum complex (hereinafter referred to as $Alq_3$). The vacuum evaporator is vacuumed to $1\times10^{-5}$ Torr or less by a vacuum pump.

A metal mask is prepared which has a rectangular or square shaped opening. The metal mask is placed over the glass substrate 1 having the separation walls 3 so that a current is applied between the glass substrate 1 and the resistance-heating board placed under the metal mask to heat the substrate 1 with the $\alpha$-NPD resistance-heating board so as to evaporate an $\alpha$-NPD layer 4a of about 50 nanometers in thickness entirely over the glass substrate 1, the anode 18 and the separation walls 3. Thereafter, a current is applied to the resistance-heating board containing $Alq_3$ so that an $Alq_3$ layer 4b of 50 nanometers in thickness is formed on the $\alpha$-NPD layer 4a. As a result, an organic electroluminescent layer 4 is formed which comprises laminations of the $\alpha$-NPD layer 4a and the $Alq_3$ layer 4b. The $\alpha$-NPD layer 4a serves as a hole transport layer whilst the $Alq_3$ layer 4b serves as an electron transport layer and a light-emitting layer.

The above vacuum evaporation is preferably carried out in a direction vertical to a surface of the substrate so as to form no shadow portion by shielding the separation walls and also the substrate 1 is rotated in a plane parallel to the surface of the substrate 1 so that the deposition of the organic molecules can be uniformed.

A shadow mask 11 of SUS430 shown in FIG. 4 has previously be placed in the vacuum evaporator before the glass substrate 1 formed with the organic electroluminescent layer 4 is placed on the shadow mask 11.

The shadow mask 11 has 32 stripe shielding portions 19 and stripe slits 13 defined by the stripe shielding portions 19. The substrate 1 is so placed that the direction along which the stripe shielding portions 19 extend is perpendicular to the direction along which the stripe lines of the separation walls 3 over the substrate 1. The stripe shielding portions 19 of the shadow mask 11 has a thickness of 0.4 millimeters, a width of 0.4 millimeters and a length of 130 millimeters. The stripe shielding portions 19 are aligned at a center pitch of 1.0 millimeter.

A magnet 14 is provided on an opposite surface o the substrate 1 to the surface on which the anode 18, the separation walls 3 and the organic electroluminescent layer 4 are provided, so that the magnet 14 faces the metal shadow mask 11 to be attracted to the separation walls 3. As a result, the stripe shielding portions 19 of the shadow mask 11 are made into securely contact with the tops of the separation walls 3. The shadow mask 11 is made of a magnetic material.

Magnesium is supplied into the resistance-heating board in the vacuum evaporator whilst silver is supplied into the other resistance-heating board. Magnesium and silver are concurrently evaporated at evaporations rates such that a ratio of magnesium to silver is 10:1. Evaporation direction of metals through the shadow mask onto the organic electroluminescent layer 4 is almost vertical to the surface of the substrate 1 and also almost isotropic. It is preferable that the substrate 1 is kept to rotate during the evaporation processes. Magnesium and silver are deposited through the stripe slits of the shadow mask 11 onto the selected regions under the stripe slits whilst no magnesium and no silver are deposited under the stripe shielding portions 19 of the shadow mask 11.

A magnesium-silver alloy metal layer is formed which extends over the separation walls 3, the organic electroluminescent layer 4 and the stripe shielding portions 19 of the shadow mask 11 but only regions under the stripe slits of the shadow mask 11 whilst no magnesium-silver alloy metal layer is formed under the stripe shielding portions 19 of the shadow mask 11. A magnesium-silver alloy metal layer has a thickness of about 200 nanometers. The substrate 1 is removed from the shadow mask 11.

With reference to FIG. 6B, the magnesium-silver alloy metal layer serves as a cathode 5. The cathode 5 comprises row stripe lines which extend in a direction perpendicular to the direction along which the stripe lines of the anode 18 extend. As a result, the organic electroluminescent display is formed which has the anode 18 of column stripe lines and separation walls 3 of column stripe lines as well as the cathode 5 of row stripe lines.

As described above, in accordance with the present invention, separation walls 3 of stripe lines are provided between the stripe lines of the anode 2 and over the substrate 1 before the organic electroluminescent layer 4 is formed and subsequently the shadow mask is placed on the separation walls wherein the shadow mask 11 is kept distanced from the organic electroluminescent layer 4. By use of the shadow mask 11, metals are evaporated to form the cathode 5. Since the organic electroluminescent layer 4 is free from any damage or scratch by contacting with the shadow mask 11, there is no possibility of formation of short circuit between the anode and cathode whereby the yield of the organic electroluminescent display can remarkable be increased.

It is also possible to form any desirable cathode patterns by selecting the height of the separation walls.

The rotation of the substrate 1 allows an effective use of the evaporation source and allows a uniform evaporation entirely over the substrate 1. This may reduce the size of the vacuum evaporator.

Third Embodiment

Figure 7:
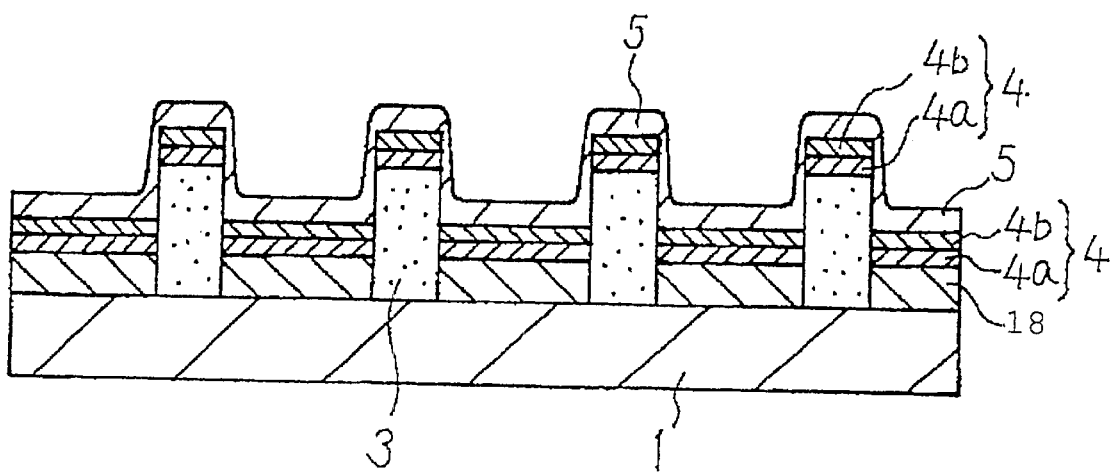
FIG. 7 is a fragmentary cross sectional elevation view illustrative of a sequential process involved in a novel method of forming a novel organic electroluminescent displays in a third embodiment in accordance with the present invention.

A third embodiment according to the present invention will be described in detail with reference to FIG. 7 which is a fragmentary cross sectional elevation view illustrative of a sequential process involved in a novel method of forming a novel organic electroluminescent displays in a third embodiment in accordance with the present invention. An indium tin oxide film having a thickness of 100 nanometers is deposited on a transparent supporting substrate 1 by a sputtering method. The transparent supporting substrate 1 may comprise a glass substrate. For example, no-alkali glass substrate is preferable because of poor moisture absorption property. A cheep low alkali glass substrate or a soda lime glass substrate are also available by keeping the substrate in dry condition.

The indium tin oxide film deposited on the glass substrate is then patterned by photo-lithography technique for etching process to form stripes of the indium tin oxide film which serves as anode 18. The stripes of the anode 18 extend in a vertical direction and aligned in a lateral direction at a constant pitch. The indium tin oxide film not only serves as the anode 18 but allows transmission of a light having been emitted from an organic electroluminescent layer, for which reason a low resistance and a high light transmittance are preferable. The anode 18 comprises 256 stripe lines having a line pitch of 0.35 millimeters, a line width of 0.25 millimeters, and a length of 29 millimeters. The stripe lines of the anode 18 extend in column direction of the display device.

Separation walls 3 in the shape of stripe lines are formed between the stripe lines of the anode 18 and over the glass substrate 1. The stripe lines of the separation walls 3 extend in the column direction or in parallel to the stripe lines of the anode 18. The pattern of the stripe lines of the separation walls 3 has a pitch of 0.35 millimeters and a width of 0.1 millimeters. The separation walls 3 have a height in the range of 10–25 micrometers.

An organic electroluminescent layer 4 is deposited by a vacuum evaporator over the glass substrate so that the organic electroluminescent layer 4 is in the shape of rectangle or square, whereby the organic electroluminescent layer 4 covers the anode 18 and the separation walls 3. Then, a shadow mask is provided which has slender stripe shielding portions extending in a direction perpendicular to the directions of the stripe lines of the walls extend. By use of the shadow mask, a metal is vacuum-evaporated to form a cathode 5 of stripe lines over the organic electroluminescent layer 4.

A structural difference of the organic electroluminescent display of this third embodiment from the foregoing first and second embodiments is in that no organic electroluminescent layer is formed on vertical side walls of the separation walls 3 and namely the organic electroluminescent layer is discontinuously formed.

The following description will highlight fabrication processes for the novel organic electroluminescent display device in the second embodiment according to the present invention.

An indium tin oxide film is deposited by a vacuum evaporation on a transparent glass substrate 1. The indium tin oxide film is then patterned by a photo-lithography technique to form an anode of a large number of stripe lines which extend in parallel to each other. A negative dry film resist 6 is adhered over the glass substrate 1 and the anode 18 by a laminator. A photo-mask 7 is used so that a near ultraviolet ray 8 is irradiated from an exposure system through the photo-mask 7 onto the dry film resist 6 over the glass substrate 1 so that a stripe pattern is transferred onto the dry film resist 6. The dry film resist 6 is commercially available from Tokyo Applied Industry Co. alpha-450. The lamination of the dry film resist 6 is carried out at a temperature in the range of 85–115° C. under a pressure in the range of 2–4 Kg/cm$^2$ at a rate of 1–3 mm/min. The photo-mask 7 has an optical shielding pattern 9 which comprises 31 stripe lines of 0.3 millimeters in width and aligned at a pitch of 1.0 millimeter. The photo-mask 7 is so positioned in a space over the dry film pattern 6 that 31 stripe lines of the optical shielding pattern 9 extend in parallel to the stripe lines of the anode 18. Sufficiently wide optical shielding patterns are placed outside the opposite end two stripe lines of the optical shielding pattern 9 at a distance of 0.6 millimeters therefrom.

The above irradiation of the near ultraviolet ray onto the dry film resist 6 causes the exposed region of the dry film resist 6 to show cross-linking reaction and becomes insoluble, whilst unexposed regions of the dry film resist 6 are then developed by use of a solution containing 0.8–1.2% of $Na_2Co_3$ and subsequently cleaned for selective releasing thereof by use of a solution of 2–4% KOH. For the development and subsequent cleaning processes, the glass substrate 1 is so placed that the dry film resist 6 faces downwardly and the glass substrate 1 is rotated at 4000 rpm during which the solutions of the developing solution and releasing solution. Are sprayed onto the dry film 6. After the selectively release of the unexposed parts of the dry film resist 6, the glass substrate 1 is dried in a clean oven at a temperature of 130° C. for 60 minutes during which the glass substrate 1 is rotated at 3000 rpm for 60 minutes.

The dry film resist 6 remains over the glass substrate 1 and between the stripe lines of the anode 18. The dry film resist comprises 63 stripe lines which extend between the stripe lines of the anode 18 and over the glass substrate 1 in a direction parallel to the stripe lines of the anode 18. The stripe lines of the patterned dry film resist 6 serve as separation walls 3. Namely, the separation walls 3 are formed comprising the stripe lines which extend between the stripe lines of the anode 18 and over the glass substrate 1. It s important that the thickness of the dry film resist 6 or the height of the separation walls 3 is required to be higher or larger than a sum of the thickness of the anode and a predetermined value corresponding to a thickness of the organic electroluminescent layer which will be formed in a later process so as to keep the organic electroluminescent layer to be distanced from a shadow mask placed on the separation walls wherein the shadow mask cover the organic electroluminescent layer. In consideration of patterning to aluminum interconnections for cathode, the thickness of the dry film resist 6 or the height of the separation walls 3 is preferably 10–25 micrometers. A width of the stripe lines of the separation walls 3 is 0.1 millimeter and the stripe lines of the separation walls 3 are aligned at a pitch of 0.35 millimeters.

The glass substrate 1 is held by a substrate holder in a vacuum evaporator so that the separation walls face downwardly. N,N'-diphenyl-N,N' bis(α-naphthyl)-1,1'-biphenyl-4,4'-diamin (hereinafter referred to as into α-NPD is supplied into a resistance-heating board of the vacuum evaporator. Into the other resistance-heat board, supplied is a tris(8-quinolight)aluminum complex (hereinafter referred to as $Alq_3$). The vacuum evaporator is vacuumed to $1 \times 10^{-5}$ Torr or less by a vacuum pump.

A metal mask is prepared which has a rectangular or square shaped opening. The metal mask is placed over the glass substrate 1 having the separation walls 3 so that a current is applied between the glass substrate 1 and the resistance-heating board placed under the metal mask to heat the substrate 1 with the α-NPD resistance-heating board so as to evaporate an α-NPD layer 4a of about 50 nanometers in thickness entirely over the glass substrate 1, the anode 18 and the separation walls 3. Thereafter, a current is applied to the resistance-heating board containing $Alq_3$ so that an $Alq_3$ layer 4b of 50 nanometers in thickness is formed on the α-NPD layer 4a. As a result, an organic electroluminescent layer 4 is formed which comprises laminations of the α-NPD layer 4a and the $Alq_3$ layer 4b. The α-NPD layer 4a serves as a hole transport layer whilst the $Alq_3$ layer 4b serves as an electron transport layer and a light-emitting layer.

The above vacuum evaporation is preferably carried out in a direction vertical to a surface of the substrate so as to form no shadow portion by shielding the separation walls and also the substrate 1 is rotated in a plane parallel to the surface of the substrate 1 so that the deposition of the organic molecules can be uniformed.

A shadow mask 11 of SUS430 shown in FIG. 4 has previously be placed in the vacuum evaporator before the glass substrate 1 formed with the organic electroluminescent layer 4 is placed on the shadow mask 11.

The shadow mask 11 has 32 stripe shielding portions 19 and stripe slits 13 defined by the stripe shielding portions 19. The substrate 1 is so placed that the direction along which the stripe shielding portions 19 extend is perpendicular to the direction along which the stripe lines of the separation walls 3 over the substrate 1. The stripe shielding portions 19 of the shadow mask 11 has a thickness of 0.4 millimeters, a width of 0.4 millimeters and a length of 130 millimeters. The stripe shielding portions 19 are aligned at a center pitch of 1.0 millimeter.

A magnet 14 is provided on an opposite surface o the substrate 1 to the surface on which the anode 18, the separation walls 3 and the organic electroluminescent layer 4 are provided, so that the magnet 14 faces the metal shadow mask 11 to be attracted to the separation walls 3. As a result, the stripe shielding portions 19 of the shadow mask 11 are made into securely contact with the tops of the separation walls 3. The shadow mask 11 is made of a magnetic material.

Magnesium is supplied into the resistance-heating board in the vacuum evaporator whilst silver is supplied into the other resistance-heating board. Magnesium and silver are concurrently evaporated at evaporations rates such that a ratio of magnesium to silver is 10:1. Evaporation direction of metals through the shadow mask onto the organic electroluminescent layer 4 is almost vertical to the surface of the substrate 1 and also almost isotropic. It is preferable that the substrate 1 is kept to rotate during the evaporation processes. Magnesium and silver are deposited through the stripe slits of the shadow mask 11 onto the selected regions under the stripe slits whilst no magnesium and no silver are deposited under the stripe shielding portions 19 of the shadow mask 11.

A magnesium-silver alloy metal layer is formed which extends over the separation walls 3, the organic electroluminescent layer 4 and the stripe shielding portions 19 of the shadow mask 11 but only regions under the stripe slits of the shadow mask 11 whilst no magnesium-silver alloy metal layer is formed under the stripe shielding portions 19 of the shadow mask 11. A magnesium-silver alloy metal layer has a thickness of about 200 nanometers. The substrate 1 is removed from the shadow mask 11.

The magnesium-silver alloy metal layer serves as a cathode 5. The cathode 5 comprises row stripe lines which extend in a direction perpendicular to the direction along which the stripe lines of the anode 18 extend. As a result, the organic electroluminescent display is formed which has the anode 18 of column stripe lines and separation walls 3 of column stripe lines as well as the cathode 5 of row stripe lines.

As described above, in accordance with the present invention, separation walls 3 of stripe lines are provided between the stripe lines of the anode 2 and over the substrate 1 before the organic electroluminescent layer 4 is formed and subsequently the shadow mask is placed on the separation walls wherein the shadow mask 11 is kept distanced from the organic electroluminescent layer 4. By use of the shadow mask 11, metals are evaporated to form the cathode 5. Since the organic electroluminescent layer 4 is free from any damage or scratch by contacting with the shadow mask 11, there is no possibility of formation of short circuit between the anode and cathode whereby the yield of the organic electroluminescent display can remarkable be increased.

It is also possible to form any desirable cathode patterns by selecting the height of the separation walls.

The rotation of the substrate 1 allows an effective use of the evaporation source and allows a uniform evaporation entirely over the substrate 1. This may reduce the size of the vacuum evaporator.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a novel organic electroluminescent display device which comprises the steps of:

forming a transparent anode of a plurality of stripes on a transparent supporting substrate;

providing a plurality of separation walls between the stripes of the anode and over the transparent supporting substrate, wherein the separation walls have a height which is higher than a sum of a thickness of the anode and a predetermined value;

forming an organic electroluminescent layer having a thickness corresponding to the above predetermined value over the anode and the separation walls; and placing a shadow mask having a plurality of slits on and in securely contact with top surfaces of the separation walls so that a metal material is evaporated through the shadow mask to selectively form a cathode of a plurality of stripes over the organic electroluminescent layer.

2. The method as claimed in claim 1, wherein the shadow mask has a large number of stripe-shaped openings, each of which extends continuously over the substrate.

3. The method as claimed in claim 1, wherein that the shadow mask has a large number of stripe-shaped openings, each of which comprises a plurality of segments separated by gaps and aligned over the substrate.

4. The method as claimed in claim 1, wherein the shadow mask with a magnetic field generator which generates a magnetic field is used for forcing the shadow mask in contact securely with the tops of the separation walls.

5. The method as claimed in claim 1, wherein the separation walls are made by a photo-resist technique using a photo-resist film.

* * * * *